(12) United States Patent
Lin

(10) Patent No.: US 6,483,753 B1
(45) Date of Patent: Nov. 19, 2002

(54) ENDIANESS INDEPENDENT MEMORY INTERFACE

(75) Inventor: Shuaibin Lin, Broomfield, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/068,680

(22) Filed: Feb. 6, 2002

(51) Int. Cl.[7] .............................. G11C 7/00; G11C 8/00
(52) U.S. Cl. ........................ 365/189.02; 365/230.02; 365/238.5
(58) Field of Search ................. 365/189.01, 189.02, 365/230.01, 230.02, 233, 238.5

(56) References Cited

U.S. PATENT DOCUMENTS 5,079,742 A * 1/1992 Simpson .................... 365/233
5,448,521 A * 9/1995 Curry et al. ........... 365/189.02

* cited by examiner

Primary Examiner—Trong Phan
(74) Attorney, Agent, or Firm—Westman, Champlin & Kelly

(57) ABSTRACT

A method and apparatus are provided for addressing a memory device. The apparatus receives a system address from a memory access device having an endianess. The system address has a word address bit corresponding to word boundaries within the memory device. The apparatus selectively inverts the word address bit as a function of the endianess of the memory access device to produce a selectively modified system address. The apparatus then accesses a memory location with the memory device based on the selectively modified system address.

13 Claims, 4 Drawing Sheets

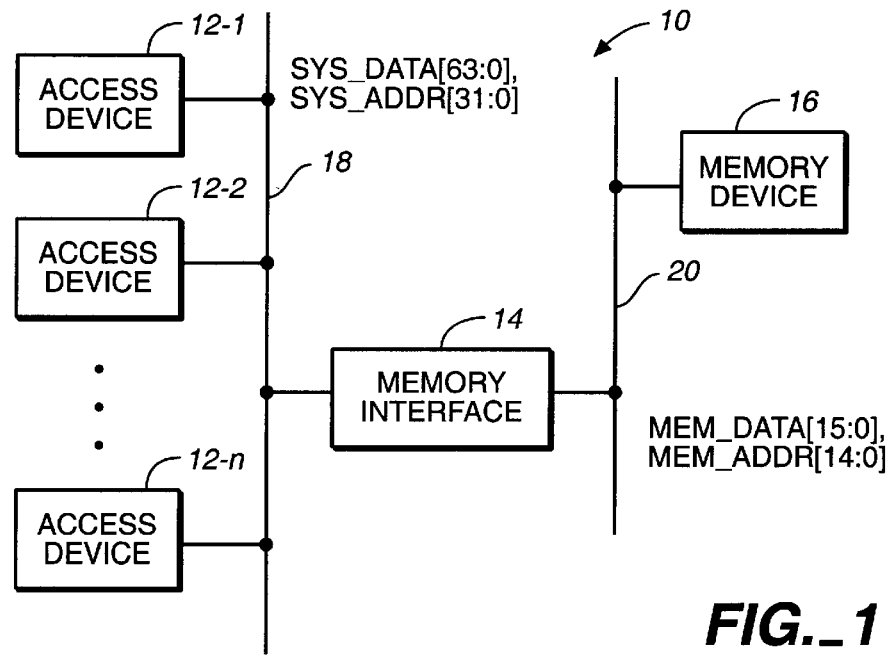
FIG._1
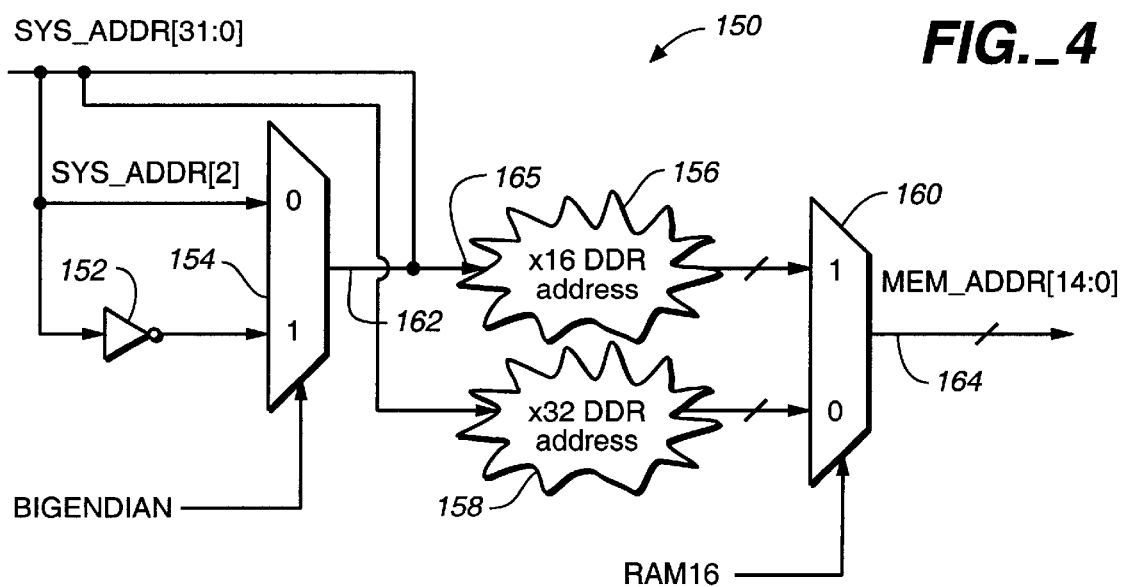
FIG._4

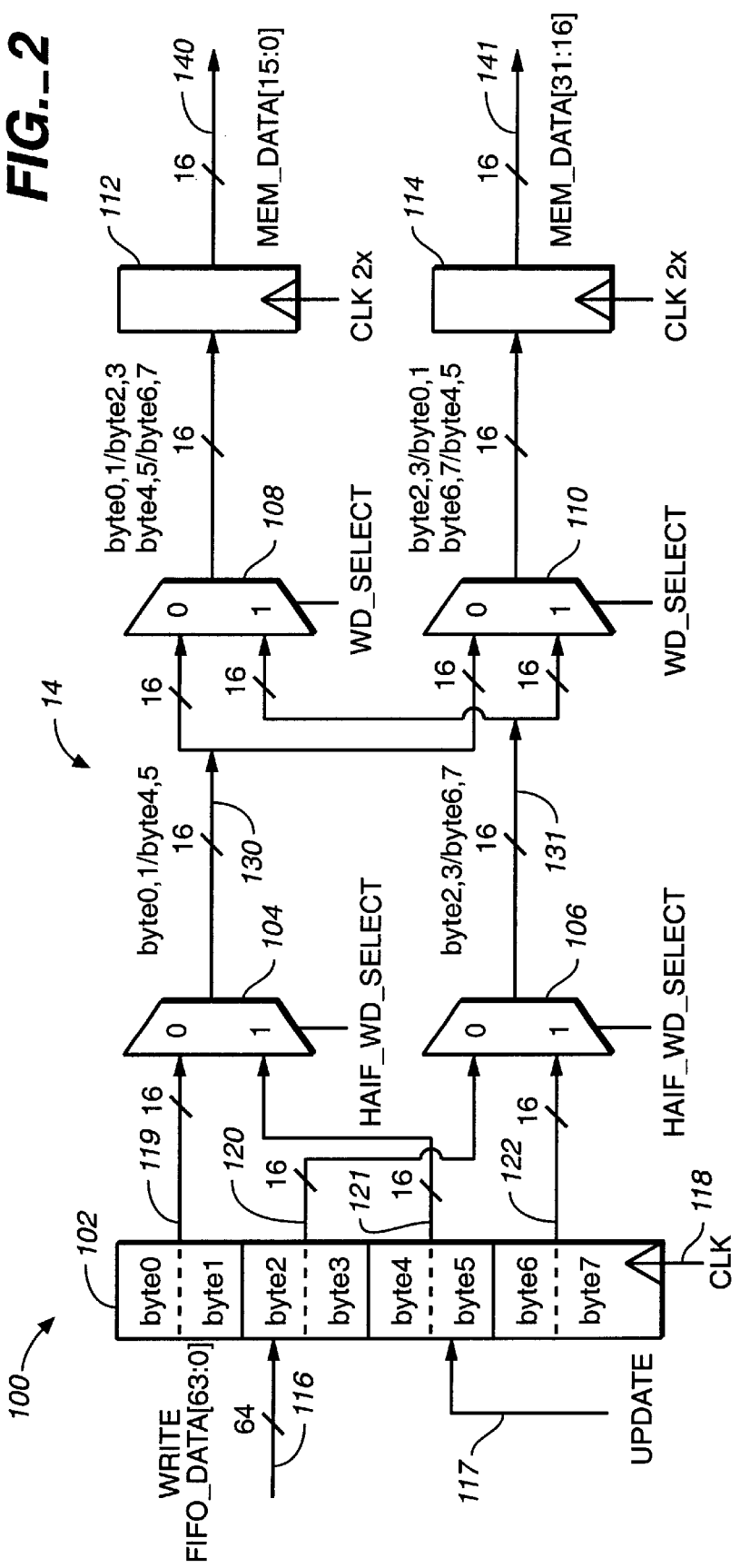

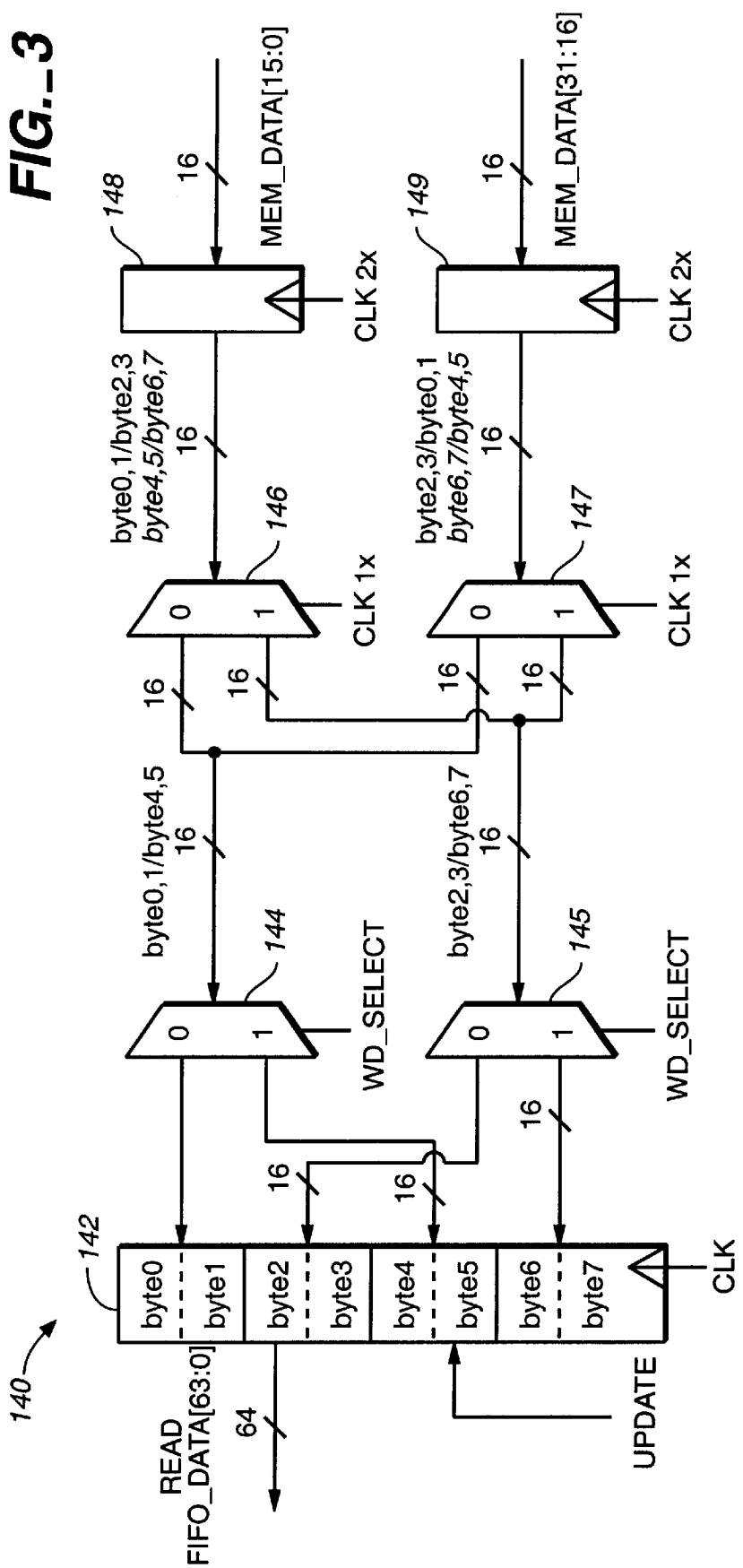

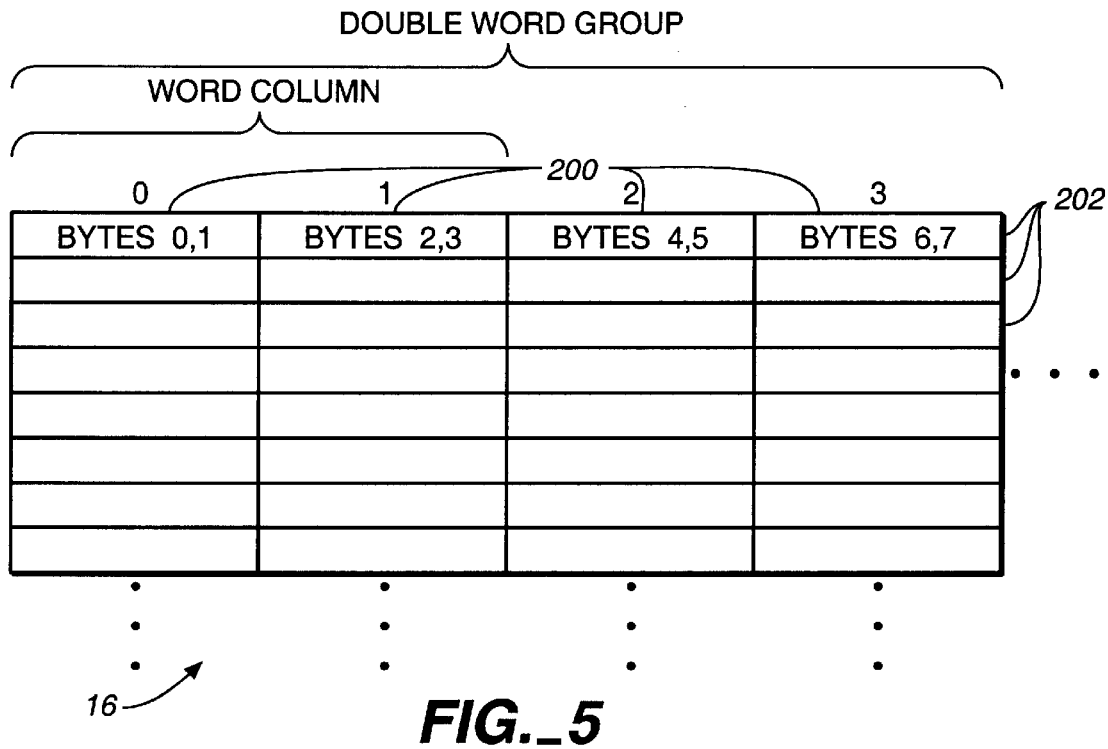
FIG._5
| MEM_ADDR[1:0] | | MEANING |
|---|---|---|
| 0 | 0 | ACCESS LSW BEGINNING AT COLUMN 0 |
| 1 | 0 | ACCESS MSW BEGINNING AT COLUMN 2 |
FIG._6

ENDIANESS INDEPENDENT MEMORY INTERFACE

FIELD OF THE INVENTION

The present invention relates to semiconductor integrated circuits and more particularly to a computer system having multiple memory access devices and a shared memory space.

BACKGROUND OF THE INVENTION

In a computer system having multiple memory access devices, a memory controller is often used to coordinate the transfer of data to and from a memory device. Each memory access device is coupled to the memory controller through a system bus. The memory controller is in turn coupled to the memory device through a memory bus. Access to the system bus and thus to the memory controller is typically coordinated by a system bus arbiter. From the memory access device's point of view, the memory device is just a data warehouse. The memory access device does not need to know how the data is stored in memory.

In a typical memory, successive data units or "words" are stored in successive columns in memory. The order in which these words are acccessed depends on the endianess of the memory device. A "little endian" memory device stores the least significant word part of a double word group into the smaller address location of a double word location in the memory, and stores the most significant word part of the double word group in the larger address location of the double word location. In contrast, a "big endian" memory device stores the least significant word part of a double word group in the larger address location of a double word location and stores the most significant word part of the double word group in the smaller address location of the double word location.

In some applications, it may be desirable to have multiple devices having different endianess access the same memory space. A "little endian" memory access device views the smaller and larger double word locations, in terms of their addresses, as containing the least significant word part and the most significant word part, respectively, of a double word group. In contrast, a "big endian" memory access device views the smaller and larger double word locations as containing the most significant word part and the least significant word part, respectively, of a double word group.

In a system having multiple memory access devices, which can have different endianess, data words stored in a memory location by one device could be retrieved by another device with a different endianess. If the system bus is wider than the memory bus, a memory access device with a different endianess would view the data words on the system bus differently than the other memory access device. As a result, the data words retrieved from shared memory could be put on the wrong portion of the system data bus if the endianess of each memory access device is not taken into careful consideration. To avoid this difficulty, multiprocessor systems typically require all devices sharing the same memory space to have the same endianess. Alternatively, the memory could be split into "bit endian" and "little endian" areas such that devices having different endianess would not share the same memory space.

This type of arrangement, with the system bus being wider than the memory bus, is common for systems containing a double data rate (DDR) synchronous dynamic random access memory (SDRAM). A DDR SDRAM transfers data on each rising and falling edge of a memory clock signal. A DDR SDRAM therefore transfers two data units per clock cycle. For example, a x16 DDR SDRAM has a 16-bit memory data bus which transfers one 16 bit half word on each clock edge. Therefore one 32-bit word is transferred during each memory clock cycle. A x32 DDR SDRAM has a 32-bit memory data bus, with one 32-bit word being transferred on each clock edge for a total of one 64-bit double word transfer for each memory clock cycle. A typical system bus has 64 data bits. Thus when a x16 DDR SDRAM is used, the width of the system bus (64 bits) is wider than the effective width of the memory bus (32 bits).

An improved memory interface is therefore desired which is capable of maintaining consistent data storing and retrieving in a shared memory space by more than one memory accessing device having different endianess, particularly for use with a DDR SDRAM.

SUMMARY OF THE INVENTION

One embodiment of the present invention relates to a method for addressing a memory device. The method includes the steps of: receiving a system address from a memory access device having an endianess, wherein the system address has a word address bit corresponding to word boundaries within the memory device; selectively inverting the word address bit as a function of the endianess of the memory access device to produce a selectively modified system address; and accessing a memory location with the memory device based on the selectively modified system address.

Another embodiment of the present invention relates to a memory interface. The memory interface includes a write data path and a read data path extending through the memory interface, a system address input and a memory address output. The system address input has multiple bits, including a word address bit. A memory address generator is coupled between the system address input and the memory address output. An endianess flag within the memory interface indicates an endianess of a memory access device coupled to the system address input. A selective inversion circuit is coupled in series between the word address bit of the system address input and the memory address generator and includes an inversion control input coupled to the endianess flag.

Yet another embodiment of the present invention relates to a computer system, which includes a memory bus, a system bus, a memory device coupled to the memory bus and a memory access device coupled to the system bus. The memory access device has an endianess and generates a system address on the system bus, which has a word address bit corresponding to word boundaries within the memory device. A memory interface device is coupled between the system bus and the memory bus and includes a selective inversion circuit for selectively inverting the word address bit as a function of the endianess of the memory access device to produce a selectively modified system address, and includes an address generator for producing a memory address on the memory bus based on the selectively modified system address.

BRIEF DESCRIPTION OF THE DRAWINGS

FIG. 1 is a block diagram of a system having an endianess independent memory interface according to one embodiment of the present invention.

FIG. 2 is a schematic diagram which illustrates a write data path within the memory interface, according to one embodiment of the present invention.

FIG. 3 is a schematic diagram which illustrates a read data path within the memory interface, according to one embodiment of the present invention.

FIG. 4 is a diagram illustrating a memory address generator within the memory interface, according to one embodiment of the present invention.

FIG. 5 is a diagram illustrating a portion of a memory device according to one embodiment of the present invention.

FIG. 6 is a table which illustrates available bit combinations for the least significant memory address bits according to one embodiment of the present invention.

DETAILED DESCRIPTION OF ILLUSTRATIVE EMBODIMENTS

FIG. 1 is a block diagram of a system 10 having an endianess-independent memory interface according to one embodiment of the present invention. System 10 includes memory access devices 12-1 to 12-n, memory interface 14, memory device 16, system bus 18, and memory bus 20. Any number of memory access devices 12-1 to 12-n can be used, where n is a positive integer variable. Memory access devices 12-1 to 12-n can include a variety of different types of devices such as one or more computer processing units (CPUs). Memory access devices 12-1 to 12-n are coupled to one another and to memory interface 14 through system bus 18. System bus 18 can be configured according to various different bus specifications in alternative embodiments, and can have a variety of bus widths.

In one embodiment, system bus 18 is consistent with the Advanced Microcontroller Bus Architecture (AMBA), available from ARM Limited of Cambridge, England. One such bus, known as the AMBA Advanced High-performance Bus (AHA) bus design, provides high performance, high clock frequency transfers between multiple bus masters and multiple bus slaves. A bus master is a device that is capable of initiating a read or write operation to read data from or write data to a slave device by providing address and control information. A bus slave device is a device that responds to a read or write request and provides a return indicating the success, failure or waiting status of the data transfer. In FIG. 1, memory access devices 12-1 to 12-n are bus masters, and memory interface 14 is a bus slave.

In the AHB bus, data transfer operations between the master and slave devices are arbitrated by an arbiter (not shown in FIG. 1), which is a device that ensures that only one bus master is allowed to initiate data transfers at a given time. When access is granted to a master device, such as memory access device 12-1, the master device sends memory interface 14 a read/write signal, a transfer size signal, a burst size signal, and a starting address for the access. The read/write signal is a single bit representing whether the master device is requesting a read or a write operation. The transfer size signal is a 3-bit code, for example, that represents the size of the transfer. The transfer size is typically an 8-bit byte, a 16-bit half word, a 32-bit word or a 64-bit double word. The burst size signal indicates if the transfer forms part of a burst, such as a burst of four, eight or sixteen data units having the indicated transfer size. The address is a 32-bit code representing the starting address in the slave device where data is to be read or written. At the same time, the bus arbiter supplies a master identification code, or tag, identifying the master device using the system bus.

In addition, according to one embodiment of the present invention, memory interface 14 also receives a flag indicating the endianess of the master device having access to system bus 18. The endianess flag can be supplied to memory interface 14 by the master device or the bus arbiter over system bus 18 or over a separate control line. Alternatively, memory interface 14 can include a register or other memory device in which the endianess flag of each memory access device 12-1 to 12-n is stored. When a particular memory access device is granted access to system bus 18, memory interface 14 reads the endianess flag of the associated device, based on the master identification code. As discussed in more detail below, memory interface 14 uses the endianess flag to control the order of access to successive memory locations in memory device 16 to thereby allow devices having different endianess to share the same memory space.

During a write operation, the write data transferred by the master device is collected in a write data FIFO (first-in-first-out) either internally or externally to memory interface 14. Memory interface 14 coordinates the transfer of data from the write data FIFO to memory device 16 over memory bus 20. For each data unit that is transferred to memory device 16, memory interface 14 supplies one or more memory addresses to memory device 16 based on the system address supplied by the master device, the transfer size and the burst type. Memory interface 14 also supplies the necessary control signals to memory device 16, such as a write enable signal, a clock signal, a clock enable signal, and a chip select signal. During a read operation, memory interface 14 supplies one or more memory addresses to memory device 16 over memory bus 20, collects the read return data in a read data FIFO and supplies the read return data to the master device over system bus 18.

In one embodiment, memory device 16 is a double data rate (DDR) synchronous dynamic random access memory (SDRAM), which transfers data on each edge of the memory clock signal. In one embodiment, memory device 16 is configured as a x16 DDR SDRAM, which transfers one 16-bit half word on each clock edge. In another embodiment, memory device 16 is configured as a x32 DDR SDRAM, which transfers one 32-bit word on each clock edge. In the embodiment shown in FIG. 1, memory device 16 is a x16 DDR SDRAM. In these two embodiments, the data portion of memory bus 20 is either 16 or 32 bits wide. The address portion of memory bus 20 is 15 bits wide, for example. In FIG. 1, the data portion of memory bus 20 is labeled MEM_DATA[15:0], and the address portion of memory bus 20 is labeled MEM_ADDR[14:0]. Since a DDR SDRAM makes two data transfers in each clock cycle, memory bus 20 has an effective data width of either 32 bits or 64 bits in these two embodiments.

However, the width of system bus 18 can be different than the width of memory bus 20. For example, the data portion of a typical system bus is 64-bits wide. The data portion of system bus 18 is labeled SYS_DATA[63:0], and the address portion of system bus 18 is labeled SYS_ADDR[31:0].

For a x16 memory device, each successive 16-bit half word transferred over memory bus 20 is stored in a successive column of the row being accessed within memory device 16. The order in which the columns are written depend on the starting address provided by the master device, the burst length and the endianess of the memory access device. Memory device 16, like access devices 12-1 to 12-n is configured to store data according to a particular endianess. If memory device 16 has a "little endian" format, memory interface 14 stores the least significant 32-bit word part of a double word group in a pair of columns having a smaller address in memory device 16, and stores the most significant word part of the double word group in a pair of columns having a larger address in memory device 16. If memory device 16 has a "big endian" format, memory interface 14 stores the least significant 32-bit word part of a double word group in the pair of columns having the larger address in memory device 16, and stores the most significant word part of the double word group in the pair of columns having the smaller address in memory device 16.

If memory access devices 12-1 to 12-n share the same memory space within memory device 16, the data retrieved by a particular memory access device could be placed on the wrong portion of the system data bus if the endianess of that access device is not taken into consideration. As described in more detail below, memory interface 14 selectively inverts a single address bit within SYS_ADDR[31:0] based on the endianess of the accessing device such that the least significant and most significant word parts of a double word group are always stored in the same relative order regardless of the endianess of the accessing device.

FIG. 2 is a schematic diagram which illustrates a write control portion of memory interface 14 in greater detail, according to one embodiment of the present invention. Memory interface 14 has a write data path 100, which includes write data register 102, half word select multiplexers 104 and 106, word select multiplexers 108 and 110, and synchronizing registers 112 and 114. Write data register 102 has a 64-bit data input 116, an update control input 117, a clock input 118 and 16-bit half-word data outputs 119–122. Data input 116 receives successive 64-bit double words (labeled WRITE_FIFO_DATA[63:0]) from a write data FIFO, which can be either internal or external to memory interface 14. The write data FIFO is coupled to the data portion of system bus 18, shown in FIG. 1. WRITE_FIFO_DATA[63:0] is written into write data register 102 when enabled by update input 117 and clocked by clock input 118. Clock input 118 is coupled to a memory controller clock CLK. Each 8-bit byte of WRITE_FIFO_DATA[63:0] is written in a respective location within write data register 102, with "byte0" being the least significant byte ("LSB") and "byte7" being the most significant byte ("MSB"). Bytes byte0 to byte3 together form a least significant word ("LSW") part of the double word stored in write data register 102, and bytes byte4 to byte7 together form a most significant word ("MSW") part of the double word. Byte0 and byte1 are coupled to half word output 119, byte2 and byte3 are coupled to half word output 120, byte4 and byte5 are coupled to half word output 121, and byte6 and byte7 are coupled to half word output 122.

As mentioned above, with a x16 DDR SDRAM, memory interface 14 transfers only one 16-bit half word on each edge of the memory clock signal. The whole double word stored in write data register 102 is not transferred at one time. Multiplexers 104, 106, 108 and 110 coordinate the transfer of each half word from write data register 102. Half word select multiplexers 104 and 106 select which word is presented to multiplexer outputs 130 and 131 as a function of half word select signal HALF_WD_SELECT. When HALF_WD_SELECT is "0", multiplexer 104 couples half word output 119 to multiplexer output 130, and multiplexer 106 couples half word output 120 to multiplexer output 131. In this state, multiplexer output 130 contains byte0 and byte1, and multiplexer output 131 contains byte2 and byte3. When HALF_WD_SELECT is a "1", multiplexer 104 couples half word output 121 to multiplexer output 130, and multiplexer 106 couples half word output 122 to multiplexer output 131. In this state, multiplexer output 130 contains byte4 and byte5, and multiplexer output 131 contains byte6 and byte7.

Word select multiplexers 108 and 110 are controlled by word select signal WD_SELECT. Word select multiplexer 108 selects which 16-bit half word of each word is presented to synchronizing register 112 on each half cycle of word select signal WD_SELECT. When WD_SELECT is a "0", multiplexer 108 couples the half word on multiplexer output 130 to the data input of register 112. When WD_SELECT is a "1", multiplexer 108 couples the half word on multiplexer output 131 to the data input of register 112. Thus, multiplexers (104, 106 and 108) sequentially provide each half word output of write data register 102 to synchronizing register 112. Synchronizing register 112 has a data output 140 (labeled MEM_DATA[15:0]), which is latched on each rising edge of memory clock CLK2x. Memory clock CLK2x has twice the frequency of WD_SELECT. Data output 140 is coupled to the data portion of memory bus 20, shown in FIG. 1.

Edge select multiplexer 110 and synchronizing register 114 are used for a x32 memory device, and are unused for a x16 memory device. Multiplexer 110 presents the half word on multiplexer output 130 to the data input of register 114 when WD_SELECT is a "0" and presents the half word on multiplexer output 131 to the data input of register 114 when WD_SELECT is a "1". Register 114 latches one half word to data output 141 (labeled MEM_DATA[31:16]) on each rising edge of CLK2x. Data output 141 is coupled to the other data portion of memory bus 20 for a x32 memory device.

For a x32 memory device, bytes 0–3 go through register 112 on the rising edge of the clock, and bytes 4–7 go through register 114 on the falling edge of the clock. In order to achieve this in a x32 case, the multiplexer select signals HALF_WD_SELECT and WD_SELECT are controlled so that bytes 0–1 always go through multiplexer 104 (when HALF_WD_SELECT is 0), multiplexer 108 (when WD_SELECT is 0), and then register 112. Bytes 6–7 always go through multiplexer 106 (when HALF_WD_SELECT is 1), multiplexer 110 (when WD_SELECT is 1), and then register 114. Bytes 2–3 always go through multiplexer 106 (when HALF_WD_SELECT is 0), multiplexer 108 (when WD_SELECT is 1), and then register 112. Bytes 4–5 always go through multiplexer 104 (when HALF_WD_SELECT is 1), multiplexer 110 (when HALF_WD_SELECT is 0), and then register 114.

As each half word is latched by synchronizing register 112 (and 114 for a x32 memory device), memory device 16 stores the half word in a corresponding column of memory. The particular column depends on the starting address provided by the memory access device, the endianess of the memory device, the burst length indicated by the memory access device and the sequence of half words being written to the memory.

FIG. 3 is a schematic diagram which illustrates a read control portion of memory interface 14, according to one embodiment of the present invention. Similar to the write control portion, memory interface 14 has a read data path 140, which includes read data register 142, word select demultiplexers 144 and 145, clock edge select demultiplexers 146 and 147, and synchronizing registers 148 and 149. Demultiplexers 144–147 operate in a similar fashion to demultiplex the successive half words presented to register 148 (and register 149 for a x32 memory device) on each edge of the memory clock and store the half words in corresponding locations in read data register 142. Again, these half words are labeled byte0 and byte1, byte2 and byte3, byte4 and byte5, and byte6 and byte7, with byte0 being the least significant byte ("LSB") and byte7 being the most significant byte ("MSB").

For read and write operations, the memory address MEM_ADDR[14:0] is generated by memory interface 14 with memory address generator 150, shown in FIG. 4. Memory address generator 150 includes system address input SYS_ADDR[31:0], endianess flag input BIGENDIAN, memory bus size flag input RAM16, memory address output MEM_ADDR[14:0], inverter 152, multiplexer 154, memory address state machines 156 and 158, and multiplexer 160.

When one of the memory access devices shown in FIG. 1 is granted access to system bus 18, the device provides a system address to the address portion of system bus 18, which is coupled to system address input SYS_ADDR [31:0]. At the same time, either the memory access device, the system bus arbiter or the memory controller supplies an endianess flag to endianess flag input BIGENDIAN indicating whether the memory access device currently having access to system bus 18 is a "big endian" device or a "little endian" device. In one embodiment, BIGENDIAN is supplied directly by the memory access device. In another embodiment, the memory controller generates BIGENDIAN in response to the master identification code, or tag, supplied by the system bus arbiter. The memory controller can have a register or look-up table that is pre-programmed with the endianess of each memory access device. This register can be used to generate the BIGENDIAN flag in response to the master identification code.

In order to allow memory access devices having different endianess to share the same memory space without requiring complex data multiplexing, memory address generator 150 selectively inverts a single bit of the system address SYS_ADDR[31:0] based on the endianess of the memory access device. In the example shown in FIG. 4, this system address bit is inverted when the memory access device is a big endian device and is not inverted when the memory access device is a little endian device. In an alternative embodiment, this system address bit is inverted when the memory access device is a little endian device and is not inverted when the memory access device is a big endian device.

This selective bit inversion effectively swaps the order in which the least significant and most significant word parts of a double word group are written to or read from the least significant and most significant portions of a double word location in the memory device, when the memory access device is big endian. As a result, the order in which the least significant and most significant word parts of a double word group are accessed in the memory device is consistent for both big endian and little endian devices.

In SYS_ADDR[31:0], bit zero is the least significant bit, and bit 31 is the most significant bit. Bit zero is a byte address bit, bit 1 is a half word address bit, and bit 2 is a word address bit. Since bit 2 identifies the word location within SYS_ADDR[31:0], bit 2 is selectively inverted by inverter 152 and multiplexer 154. SYS_ADDR[2] is coupled directly to a first data input of multiplexer 154 and is coupled to a second data input of multiplexer 154 through inverter 152. The endianess flag BIGENDIAN is coupled to the select input of multiplexer 154. When BIGENDIAN is a "0", multiplexer 154 couples the original system address bit SYS_ADDR[2] to multiplexer output 162 without inversion. When BIGENDIAN is a "1", indicating a BIGENDIAN memory access device, multiplexer 154 couples the inverted system address bit SYS_ADDR[2] to multiplexer output 162. The selectively inverted system address bit SYS_ADDR[2] is then joined with the remaining system address bits SYS_ADDR[31:3, 1:0] to form a new, selectively modified system address. The selectively modified system address is then provided to memory address state machine 156.

Memory address state machines 156 and 158 generate memory addresses for memory configurations with 16-bit and 32-bit data buses, respectively. These addresses are generated based on the newly formed system address, the transfer size and the burst type and the sequence of transfers within a particular burst. Memory address state machine 158 receives SYS_ADDR[31:0] with the original address bit SYS_ADDR[2]. When memory bus 20 is the same size as system bus 18, no address bit inversion is required. The memory addresses generated by state machine 158 are coupled to a first data input of multiplexer 160, and the memory addresses generated by state machine 156 are coupled to a second data input of multiplexer 160.

When the memory data bus is 32-bits wide, memory controller 14 sets RAM16 to "0", causing multiplexer 160 to couple the memory address generated by state machine 158 to multiplexer output 164 as MEM_ADDR[14:0]. When the memory data bus is 16-bits wide, memory controller 14 sets RAM16 to "1", causing multiplexer 160 to couple the memory address generated by state machine 156 to multiplexer output 164 as MEM_ADDR[14:0].

FIG. 5 is a diagram illustrating a portion of memory device 16 according to one embodiment of the present invention. Memory device 16 has a plurality of columns 200 and a plurality of rows 202. In the embodiment shown in FIG. 4, memory device 16 is a x16 memory device, wherein each column 200 is 16-bits wide. Each column can therefore be called a "half word column". The first four half word columns are labeled "0" to "3". Each pair of neighboring adjacent "columns" is one 32-bit word wide. Each pair of columns can therefore be called a "word column". Columns "0" to "3" are therefore labeled a "double word group".

In one embodiment, memory address bit MEM_ADDR [0] sent to memory device 16 identifies the column number of the access, while memory address bit MEM_ADDR[1] identifies the column-pair number of the access. So, memory address bit MEM_ADDR[1] is called a word address bit. However, other memory address bits can be the word address bit in alternative embodiments, depending on the address scheme of the memory.

In one embodiment, memory controller 14 starts memory access bursts at even-numbered columns. Memory address state machines 156 and 158 (shown in FIG. 4) always reset memory address bit MEM_ADDR[0] to "0" before the memory address is sent to memory device 16. Memory address bit MEM_ADDR[0] is only used to determine which data block is significant in read operations and which data blocks should be masked during write operations.

FIG. 6 is a table illustrating the available bit combinations for memory address bits MEM_ADDR[1:0]. For simplicity, the more significant memory address bits are ignored in this example. In this example, memory device 16 is assumed to be a "little endian" device. When MEM_ADDR[1:0] are "00", this memory address indicates a least significant word ("LSW") access beginning at column 0 in FIG. 5. When MEM_ADDR[1:0] is a "10", this indicates a most significant word ("MSW") access beginning at column 2. If bytes 0–3 of write data register 102 are written during the first memory clock cycle, and bytes 4–7 are written during the second memory clock cycle, bytes 0–3 will be written into columns 0 and 1 in memory 16, and bytes 4–7 will be written into columns 2 and 3, as shown in FIG. 5.

By selectively inverting the original word address bit SYS_ADDR[2:], the order in which the least significant and most significant word parts of a double word group are accessed in neighboring word columns is maintained for each memory access even if the storing device and the retrieving device have different endianess.

EXAMPLE

With memory device 16 being a little endian device, the word address bit of the memory address has the following meaning:

MEM_ADDR[1]=0→Access LSW portion, bytes 0–3; and

MEM_ADDR[1]=1→Access MSW portion, bytes 4–7.

Thus, when MEM_ADDR[1]=0, bytes 0–3 will be accessed from memory device 16 as the least significant word part of a double word group. When MEM_ADDR[1]=1, bytes 4–7 will be accessed from memory device 16 as the most significant word part of a double word group.

Similarly, if memory access device 12-1 (shown in FIG. 1) is a little endian device then the word address bit of the system address produced by device 12-1 would have the following meaning:

SYS_ADDR[2]=0→Access LSW portion, bytes 0–3; and

SYS_ADDR[2]=1→Access MSW portion, bytes 4–7.

Memory access device 12-1 would attempt to access the least significant word portion by setting the word address bit SYS_ADDR[2] to "0" and would attempt to access the most significant word portion by setting SYS_ADDR[2] to "1".

For a little endian device, memory address generator 150 (shown in FIG. 3) does not invert the system word address bit SYS_ADDR[2] when generating the corresponding memory word address bit MEM_ADDR[1]. Thus, when SYS_ADDR[2]=0, MEM_ADDR[1]=0, and bytes 0–3 are accessed from columns 0 and 1 (shown in FIG. 5) of memory device 16. When SYS_ADDR[2]=1, MEM_ADDR[1]=1, and bytes 4–7 are accessed from columns 2 and 3 (shown in FIG. 5) from memory device 16.

In contrast, if memory access device 12-2 is a big endian device, then the word address bit of the system address produced by device 12-2 would have the following meaning:

SY_ADDR[2]=0→Access MSW portion, bytes 4–7; and

SYS_ADDR[2]=1→Access LSW portion, bytes 0–3.

Memory access device 12-2 would set the system word address bit SYS_ADDR[2] to "0" to access the most significant word portion and would set SYS_ADDR[2] to "1" to access the least significant word portion.

Since memory access device 12-2 is a big endian device in this example, memory address generator 150 inverts the system word address bit SYS_ADDR[2] prior to generating the corresponding memory word address. When SYS_ADDR[2]=0, MEM_ADDR[1]=1, and bytes 4–7 are accessed from columns 2 and 3 of memory device 16. When SYS_ADDR[2]=1, MEM_ADDR[1]=1, and bytes 0–3 are accessed from columns 0 and 1 of memory device 16.

Therefore, MEM_ADDR[1] could be "0" because the original system address bit SYS_ADDR[2] is "0" from a little endian master or because the system address bit SYS_ADDR[2] is "1" from a bit endian master. Memory address bit MEM_ADDR[1] could be a "1" because the system address bit SYS_ADDR[2] is a "1" from a little endian master or because SYS_ADDR[2] is a "0" from a big endian master. This is due to the fact that SYS_ADDR[2] will be inverted by the memory controller to create the memory address bit MEM_ADDR[1] when a big endian master is writing to or reading from memory device 16, which is a little endian device in this example.

As a result, both big endian and little endian devices can share the same memory address space regardless of whether the memory bus is the same size or a different size than the system bus. The same data is retrieved from memory device 16 regardless of the difference between the endianess of the storing device and the retrieving device. The address manipulation is very easy to implement and has a low cost in terms of area and power consumption on an integrated circuit. Memory interface 14 is therefore endianess-independent through the selective inversion of the word address bit.

Although the present invention has been described with reference to preferred embodiments, workers skilled in the art will recognize that changes may be made in form and detail without departing from the spirit and scope of the invention. For example, the endianess independent interface can be used in any shared memory system which could have bus masters with different endianess. In addition, the term "coupled" used in the specification and the claims can include a direct connection and an a connection through one or more intermediate components. The term "word" used in the specification and the claims can refer to any length data unit. A 32-bit word is provided as an example only.

What is claimed is:

1. A method of addressing a memory device, the method comprising:

(a) receiving a first system address from a first memory access device having a first endianess, wherein the first system address has a word address bit corresponding to word boundaries within the memory device;

(b) selectively inverting the word address bit in the first system address as a function of the first endianess to produce a selectively modified first system address; and (c) accessing a memory location with the memory device based on the selectively modified first system address.

2. The method of claim 1 and wherein the method further comprises:

(d) receiving a second system address from a second memory access device having a second endianess, wherein the second system address has a word address bit corresponding to word boundaries within the memory device;

(e) selectively inverting the word address bit in the second system address as a function of the second endianess to produce a selectively modified second system address; and (f) accessing a memory location with the memory device corresponding to the selectively modified second system address.

3. The method of claim 2 wherein:

the second endianess is different than the first endianess;

the first endianess causes the word address bit in the first system address to be inverted in step (b) such that the selectively modified second system address is modified in step (b); and the second endianess causes the word address bit in the first system address not to be inverted in step (e) such that the selectively modified second system address is not modified in step (e).

4. The method of claim 1 and further comprising:

(d) generating a first memory address based on the selectively modified first system address; and (e) applying the first memory address to the memory device for accessing the memory location in step (c).

5. The method of claim 1 and further comprising:

(d) performing steps (a) through (c) with a memory controller which is coupled to the first memory access device through a system bus and is coupled to the memory device through a memory bus;

(e) performing the selective inversion step (b) with the memory controller if the memory bus has an effective data width that is different than that of the system bus; and (f) bypassing the selective inversion step (b) if the memory bus has an effective data width that is the same as that of the system bus.

6. The method of claim 1 wherein:

the first endianess of the first memory access device can be one of a first endianess type or a second endianess type;

if the first memory access device has the first endianess type, the first memory access device sets the word address bit of the first system address to a first state to indicate access to a smaller address location of a double word group in the memory device or to a second, different state to indicate access to a larger address location of the double word group in the memory device; and if the first memory access device has the second endianess type, the first memory access device sets the word address bit of the first system address to the first state to indicate access to the larger address location of the double word group in the memory device or to the second state to indicate access to the smaller address location of the double word group in the memory device.

7. A memory interface comprising:

a write data path and a read data path extending through the memory interface;

a system address input having multiple bits, including a word address bit;

a memory address output;

a memory address generator coupled between the system address input and the memory address output;

an endianess flag indicating endianess of a memory access device coupled to the system address input; and a selective inversion circuit coupled in series between the word address bit of the system address input and the memory address generator and comprising an inversion control input coupled to the endianess flag.

8. The memory interface of claim 7 wherein the selective inversion circuit comprises:

an inverter; and a multiplexer having a first data input which is coupled to the word address bit, a second data input which is coupled through the inverter to the word address bit, a data output which is coupled to the memory address generator, and a select input which forms the selective inversion control input.

9. A computer system comprising:

a memory bus;

a system bus;

a memory device coupled to the memory bus;

a first memory access device coupled to the system bus and having a first endianess, wherein the first memory access device generates a first system address on the system bus having a word address bit corresponding to word boundaries within the memory device; and a memory interface coupled between the system bus and the memory bus and comprising selective inversion means for selectively inverting the word address bit in the first system address as a function of the first endianess to produce a selectively modified first system address and address generation means for producing a first memory address on the memory bus based on the selectively modified first system address.

10. The computer system of claim 9 and further comprising:

a second memory access device coupled to the system bus and having a second endianess, wherein the second memory access device generates a second system address on the system bus having a word address bit corresponding to word boundaries within the memory device;

wherein the selective inversion means selectively inverts the word address bit in the second system address as a function of the second endianess to produce a selectively modified second system address; and wherein the address generation means produces a second memory address on the memory bus based on the selectively modified second system address.

11. The computer system of claim 10 wherein:

the second endianess is different than the first endianess;

the selective inversion means inverts the word address bit in the first system address in response to the first endianess; and the selective inversion means does not invert the word address bit in the second system address in response to the second endianess.

12. The computer system of claim 11 wherein:

the first memory access device, which has the first endianess type, sets the word address bit of the first system address to a first state to indicate access to a smaller address location of a double word group in the memory device or to a second, different state to indicate access to a larger address location of the double word group in the memory device; and the second memory access device, which has the second endianess type, sets the word address bit of the second system address to the first state to indicate access to the larger address location of the double word group in the memory device or to the second state to indicate access to the smaller address location of the double word group in the memory device.

13. The computer system of claim 9 wherein the memory interface further comprises:

means for bypassing the selective inversion means if the memory bus has an effective data width that is the same as that of the system bus.

* * * * *